United States Patent
Tanabe et al.

(10) Patent No.: US 8,410,524 B2
(45) Date of Patent: Apr. 2, 2013

(54) GROUP III NITRIDE SEMICONDUCTOR DEVICE AND EPITAXIAL SUBSTRATE

(75) Inventors: Tatsuya Tanabe, Itami (JP); Kouhei Miura, Osaka (JP); Makoto Kiyama, Itami (JP); Takashi Sakurada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 119 days.

(21) Appl. No.: 11/569,500

(22) PCT Filed: Mar. 6, 2006

(86) PCT No.: PCT/JP2006/304262
§ 371 (c)(1),
(2), (4) Date: Nov. 22, 2006

(87) PCT Pub. No.: WO2006/100897
PCT Pub. Date: Sep. 28, 2006

(65) Prior Publication Data
US 2009/0189186 A1    Jul. 30, 2009

(30) Foreign Application Priority Data

Mar. 23, 2005 (JP) ................. 2005-084378
Jan. 27, 2006 (JP) ................. 2006-019473

(51) Int. Cl.
*H01L 29/66* (2006.01)

(52) U.S. Cl. . 257/192; 257/190; 257/191; 257/E21.108; 438/258; 438/259; 438/270; 438/46

(58) Field of Classification Search ........... 257/100, 257/99, 102, 554, 183, 190–192, 200, E21.108; 438/258–293, 46–47
See application file for complete search history.

(56) References Cited

U.S. PATENT DOCUMENTS 6,407,409 B2 * 6/2002 Cho et al. ............... 257/78
6,592,663 B1   7/2003 Sarayama et al.
(Continued)

FOREIGN PATENT DOCUMENTS

JP      411017272     * 1/1999
JP    2002-289528 A   10/2002
(Continued)

OTHER PUBLICATIONS

Khana et al., "GaN—AlGaN heterostructure field-effect transistors over bulk GaN substrates" Journal of Applied Physics, Vo. 76, No. 25 p. 3807 (2000).*

(Continued)

*Primary Examiner* — Evan Pert
*Assistant Examiner* — Mark A Laurenzi
(74) *Attorney, Agent, or Firm* — James W. Judge

(57) ABSTRACT

Affords Group III nitride semiconductor devices in which the leakage current from the Schottky electrode can be reduced. In a high electron mobility transistor 11, a supporting substrate 13 is composed of AlN, AlGaN, or GaN, specifically. An $Al_yGa_{1-y}N$ epitaxial layer 15 has a full-width-at-half maximum of (0002) plane XRD of 150 sec or less. A GaN epitaxial layer 17 is provided between the gallium nitride supporting substrate and the $Al_yGa_{1-y}N$ epitaxial layer ($0<Y\leq 1$). A Schottky electrode 19 is provided on the $Al_yGa_{1-y}N$ epitaxial layer 15. The Schottky electrode 19 constitutes a gate electrode of the high electron mobility transistor 11. The source electrode 21 is provided on the gallium nitride epitaxial layer 15. The drain electrode 23 is provided on the gallium nitride epitaxial layer 15.

2 Claims, 8 Drawing Sheets

U.S. PATENT DOCUMENTS

2005/0167697 A1* 8/2005 Flynn et al. .................. 257/194
2006/0006500 A1* 1/2006 Piner et al. .................. 257/613
2008/0048172 A1* 2/2008 Muraki et al. ................. 257/13

FOREIGN PATENT DOCUMENTS

| JP | 2003-045899 A | 2/2003 |
| JP | 2003-059946 A | 2/2003 |
| JP | 2004-327882 A | 11/2004 |
| TW | 200509414 | 3/2005 |

OTHER PUBLICATIONS

Schremer et al., "High electron mobility AlGaNÕGaN heterostructure on (111) Si" Applied Physics Letters, vol. 76, No. 6 p. 736 (2000).*

Arulkumaran et al. "characterization of different Al content AlxGa1-x/GaN heterostructures and high electron-mobility transistors on sapphire" (2003), J. Vac. Sci. Technol. B 21(2), Mar./Apr. 2003.*

Kubo "growth of homoepitaxial GaN layers and GaN/AlGaN multiple quantum wells on GaN single crystal substrates by molecular beam epitaxy" Proc. SPIE vol. 4776 2002.*

M. A. Khan et al., "GaN—AlGaN Heterostructure Field-Effect Transistors Over Bulk GaN Substrates," Applied Physics Letters, Jun. 19, 2000, pp. 3807-3809, vol. 76, No. 25, American Institute of Physics, NY.

K. K. Chu et al., "9.4-W/mm Power Density AlGaN—GaN HEMTs on Free-Standing GaN Substrates," IEEE Electron Device Letters, Sep. 1, 2004, pp. 596-598, vol. 25, No. 9, IEEE, NY.

D. F. Storm et al., "Room Temperature Hall Mobilities above 1900cm2/Vs in MBE-Grown AlGaN/GaN HEMT Structures," Electronics Letters, Sep. 16, 2004, pp. 1226-1227, vol. 40, No. 19, IEEE, NY.

T. Nanjo, et al. "Improvement of DC and RF Characteristics of AlGaN/GaN High Electron Mobility Transistors by Thermally Annealed Ni/Pt/Au Schottky Gate," Jananese Journal of Applied Physics, 2004, pp. 1925-1929, vol. 43, No. 4B, the Japan Society of Applied Physics, Tokyo.

* cited by examiner

GROUP III NITRIDE SEMICONDUCTOR DEVICE AND EPITAXIAL SUBSTRATE

TECHNICAL FIELD

The present invention relates to Group III nitride semiconductor devices and epitaxial substrates.

BACKGROUND ART

In Non-Patent Document 1, high electron mobility transistors (HEMT) are disclosed. The high electron mobility transistors have an AlGaN/GaN heterostructure epitaxially grown on a sapphire substrate. In order to manufacture the high electron mobility transistors, after forming a low-temperature GaN layer on the sapphire substrate, an i-type GaN layer of 2 to 3 μm is formed. On the GaN layer, an i-type AlGaN layer of 7 nm, an n-type AlGaN layer of 15 nm, and an i-type AlGaN layer of 3 nm are formed in that order. The Schottky electrode is composed of Ni(3 nm)/Pt(300 nm)/Au(300 nm). Non-Patent Document 1: "Improvement of DC Characteristics of AlGaN/GaN High Electron Mobility Transistors Thermally Annealed Ni/Pt/Au Schottky Gate" *Japanese Journal of Applied Physics* Vol. 43, No. 4B, 2004, pp. 1925-1929.

DISCLOSURE OF INVENTION

Problems Invention Is to Solve

High electron mobility transistors manufactured by conventional technology are provided with a GaN layer and an AlGaN layer on a supporting body of sapphire. A Schottky gate is formed on the episurface of the AlGaN layer. According to investigations by the inventors, in high electron mobility transistors manufactured using an epitaxial substrate provided with a GaN film and an AlGaN film on a sapphire substrate, the withstand voltage between the gate and the drain is low, such that the enhanced output power that is the goal is not attained. The reason for this is thought to be due to the larger leakage current from the gate electrode. In addition, according to experiments by the inventors, numerous screw dislocations are present in the AlGaN film. If the gate electrode is fabricated on the surface of the AlGaN film the Schottky barrier is lowered due to the interface state originating in the screw dislocations. As a result, the leakage current from the gate electrode becomes large.

Although it is necessary to improve the crystal quality of the AlGaN film in order to lower the interface state, it is not easy to improve the crystal quality as expected. The inventors have conducted various experiments in order to investigate which kind of crystal quality of the AlGaN film is related to the leakage current from the gate electrode.

Means for Resolving the Problem

An object of the present invention, brought about taking the above-described circumstances into consideration, is to make available Group III nitride semiconductor devices in which the leakage current from the Schottky electrode can be reduced, and meanwhile an object is to make available epitaxial substrates for manufacturing the Group III nitride semiconductor devices.

One aspect of the present invention involves a Group III nitride semiconductor device. The Group III nitride semiconductor device is furnished with (a) a supporting substrate composed of $Al_xGa_{1-x}N$ ($0 \leq x \leq 1$), (b) an $Al_yGa_{1-y}N$ epitaxial layer ($0 < y \leq 1$) having a full-width-at-half maximum for (0002) plane XRD of 150 sec or less, (c) a GaN epitaxial layer provided between the supporting substrate and the $Al_yGa_{1-y}N$ epitaxial layer, (d) a Schottky electrode provided on the $Al_yGa_{1-y}N$ epitaxial layer, (e) a source electrode provided on the gallium nitride epitaxial layer, and (f) a drain electrode provided on the gallium nitride epitaxial layer.

According to the experiments by the inventors, it has been found that the leakage current from the Schottky electrode in contact with the $Al_yGa_{1-y}N$ epitaxial layer ($0 < y \leq 1$) is related to the full-width-at-half maximum for (0002) plane XRD. According to the present invention, since the full-width-at-half maximum for (0002) plane XRD is 150 sec or less, the leakage current from the Schottky electrode can be reduced.

In a Group III nitride semiconductor device involving the present invention, it is preferable that aluminum mole fraction y of the $Al_yGa_{1-y}N$ epitaxial layer be between 0.1 and 0.7, inclusive.

If the aluminum mole fraction y is less than 0.1, the band offset becomes small so that two-dimensional electron gas having enough density at the AlGaN/GaN interface is not formed. If the aluminum mole fraction y is more than 0.7, it is highly likely that cracks are generated in the AlGaN layer. The generation of the cracks prevents the two-dimensional electron gas from being formed at the AlGaN/GaN interface.

In a Group III nitride semiconductor device involving the present invention, it is preferable that the $Al_yGa_{1-y}N$ epitaxial layer has a thickness between 5 nm and 50 nm, inclusive.

If the thickness of the $Al_yGa_{1-y}N$ epitaxial layer is less than 5 nm, the distortion at the AlGaN/GaN interface becomes small so that the two-dimensional electron gas can not be formed. If the thickness of the $Al_yGa_{1-y}N$ epitaxial layer is more than 50 nm, it is highly likely that the cracks are generated in the AlGaN layer. The generation of the cracks prevents the two-dimensional electron gas from being formed at the AlGaN/GaN interface.

In a Group III nitride semiconductor device involving the present invention, it is preferable that the supporting substrate be composed of gallium nitride. As a result, a Group III nitride semiconductor device can be provided using a supporting substrate having a low dislocation density.

A separate aspect of the present invention involves an epitaxial substrate for a Group III nitride semiconductor device. The epitaxial substrate is furnished with (a) a substrate composed of $Al_xGa_{1-x}N$ ($0 < x \leq 1$), (b) an $Al_yGa_{1-y}N$ epitaxial film ($0 < y \leq 1$) having a full-width-at-half maximum for (0002) plane XRD of 150 sec or less, and (c) a gallium nitride epitaxial film provided between the substrate and the $Al_yGa_{1-y}N$ epitaxial film.

According to the experiments by the inventors, it has been found that the leakage current from the Schottky electrode in contact with the $Al_yGa_{1-y}N$ epitaxial film ($0 < y \leq 1$) is related to the full-width-at-half maximum for (0002) plane XRD. According to the epitaxial substrate, since the full-width-at-half maximum for (0002) plane XRD is 150 sec or less, the leakage current from the Schottky electrode formed on the $Al_yGa_{1-y}N$ epitaxial film is small. Consequently, for example, epitaxial substrates preferably for high electron mobility transistors can be provided.

In an epitaxial substrate involving the present invention, it is preferable that aluminum mole fraction y of the $Al_yGa_{1-y}N$ epitaxial film be between 0.1 and 0.7, inclusive.

If the aluminum mole fraction y of the $Al_yGa_{1-y}N$ epitaxial film is smaller than 0.1, the band offset becomes small so that two-dimensional electron gas having enough density at the AlGaN/GaN interface is not formed. If the aluminum mole fraction y of the $Al_yGa_{1-y}N$ epitaxial film is more than 0.7, it is highly likely that cracks are generated in the AlGaN layer. The generation of the cracks prevents the two-dimensional electron gas from being formed at the AlGaN/GaN interface.

In an epitaxial substrate involving the present invention, it is preferable that the $Al_yGa_{1-y}N$ epitaxial film has a thickness between 5 nm and 50 nm, inclusive.

If the thickness of the $Al_yGa_{1-y}N$ epitaxial layer is less than 5 nm, the distortion at the AlGaN/GaN interface becomes small so that the two-dimensional electron gas can not be formed. If the thickness of the $Al_yGa_{1-y}N$ epitaxial layer is more than 50 nm, it is highly likely that the cracks are generated in the AlGaN layer. The generation of the cracks prevents the two-dimensional electron gas from being formed at the AlGaN/GaN interface.

In an epitaxial substrate involving the present invention, it is preferable that the substrate be a gallium nitride substrate. As a result, an epitaxial substrate can be provided for a Group III nitride semiconductor device using a substrate having a low dislocation density.

From the following detailed description of the preferred embodiments of the present invention in conjunction with the accompanying drawings, the foregoing and other objects, features, aspects and advantages of the present invention will become readily apparent.

Effects Of The Invention

As described above, the present invention affords a Group III nitride semiconductor device in which the leakage current from the Schottky electrode is decreased. Furthermore, the present invention affords an epitaxial substrate for manufacturing the Group III nitride semiconductor device.

LEGEND

11, 11a, 11b, 11c, 11d: high electron mobility transistor; 13: supporting substrate; 14: additional gallium nitride semiconductor layer; 15: $Al_yGa_{1-y}N$ epitaxial layer (0<y≦1); 16: contact layer; 17: GaN epitaxial layer; 19, 19a: Schottky electrode; 21, 21a, 21b: source electrode; 23, 23a, 23b: drain electrode; 31: gallium nitride substrate; 33: gallium nitride film; 35: AlGaN film; A: epitaxial substrate; 37a: source electrode; 37b: drain electrode; 39: gate electrode; 41: sapphire substrate; 42: seed layer; 43: gallium nitride film; 45: AlGaN film; B: epitaxial substrate; 47a: source electrode; 47b: drain electrode; 49: gate electrode; 80: reactor; 83: gallium nitride freestanding substrate; 85: GaN epitaxial film; 87: AlGaN epitaxial film; 81: epitaxial substrate; 82: gallium nitride freestanding substrate; 82c: high dislocation region; 82d: low dislocation region; 84: gallium nitride supporting substrate; 84c: high dislocation region; 84d: low dislocation region.

BEST MODE FOR CARRYING OUT THE INVENTION

Insights into the present invention will be readily understood in conjunction with the following detailed description with reference to the accompanying figures for illustration. Hereinafter, referring to the accompanying figures, embodiments according to Group III nitride semiconductor devices and epitaxial substrates of the present invention will be described. In the embodiments, high electron mobility transistors as a Group III nitride semiconductor device will be described. Note that where possible identical components are labeled with the same reference marks.

Embodiment Mode 1

Figure 1:
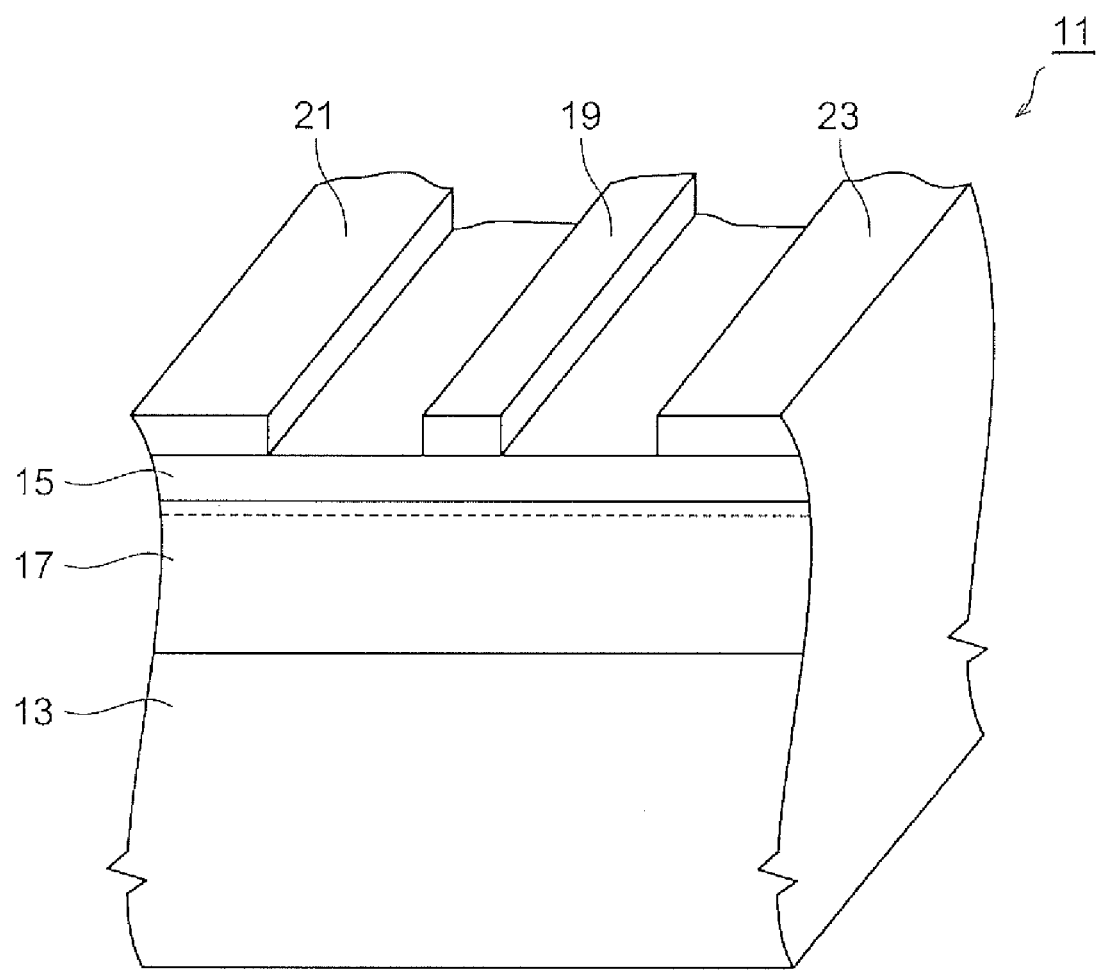
FIG. 1 is a view representing the high electron mobility transistor involving Embodiment Mode 1.

FIG. 1 is a view representing a high electron mobility transistor involving Embodiment Mode 1. The high electron mobility transistor 11 is furnished with a supporting substrate 13, an $Al_yGa_{1-y}N$ epitaxial layer (0<y≦1) 15, a GaN epitaxial layer 17, a Schottky electrode 19, a source electrode 21, and a drain electrode 23. The supporting substrate 13 is composed of $Al_xGa_{1-x}N$ (0<x≦1), more specifically, AlN, AlGaN, or GaN. The $Al_yGa_{1-y}N$ epitaxial layer 15 has a full-width-at-half maximum for (0002) plane XRD of 150 sec or less. The GaN epitaxial layer 17 is provided between the gallium nitride supporting substrate 13 and the $Al_yGa_{1-y}N$ epitaxial layer 15. The Schottky electrode 19 is provided on the $Al_yGa_{1-y}N$ epitaxial layer 15. The source electrode 21 and the drain electrode 23 are provided on the GaN epitaxial layer 17. As one example of the present embodiment, the source electrode 21 may be provided on the $Al_yGa_{1-y}N$ epitaxial layer 15. Moreover, the drain electrode 23 may be provided on the $Al_yGa_{1-y}N$ epitaxial layer 15. In this example, the source electrode 21 is in contact with the $Al_yGa_{1-y}N$ epitaxial layer 15, and the drain electrode 23 is in contact with the $Al_yGa_{1-y}N$ epitaxial layer 15. The Schottky electrode 19 constitutes a gate electrode of the high electron mobility transistor 11.

According to the inventors' experiments, it has been found that the leakage current from the Schottky electrode 19 in contact with the $Al_yGa_{1-y}N$ epitaxial layer 15 is related to the full-width-at-half maximum for (0002) plane XRD. Since the full-width-at-half maximum for (0002) plane XRD is 150 sec or less, the leakage current from the Schottky electrode 19 can reduced.

Figure 2A:
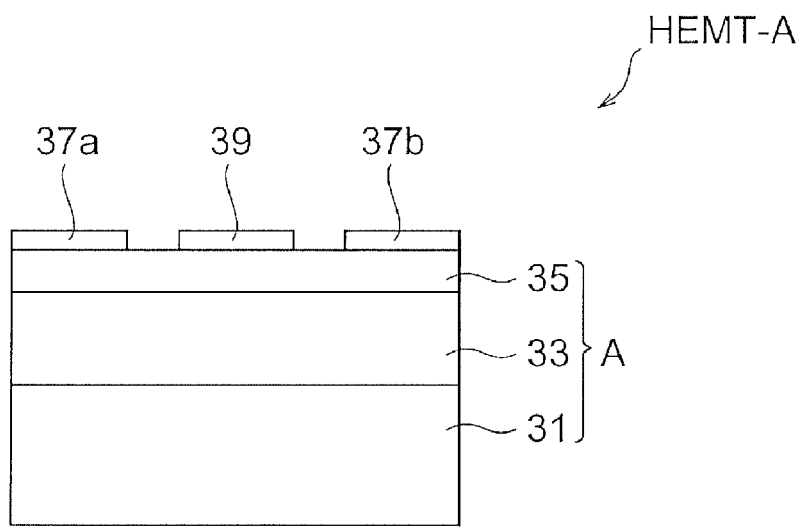
FIG. 2A is a view representing the structure of the high electron mobility transistor (HEMT) in an the embodiment examples.
Figure 2B:
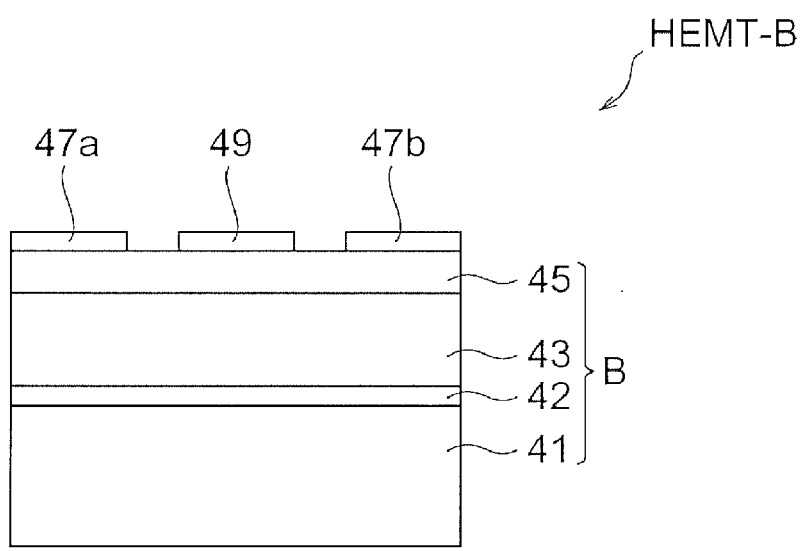
FIG. 2B is a view representing the structure of the HEMT in the experiments.

FIG. 2A is a view representing structures of a high electron mobility transistor (HEMT) involving Embodiment Example. FIG. 2B is a view representing structures of an HEMT involving Experiment.

Embodiment Example 1

A gallium nitride substrate 31 is placed in a reactor of an MOVPE device. Supplying gases including hydrogen, nitrogen, and ammonia into the reactor, the gallium nitride substrate 31 undergoes a heat treatment at 1100 degrees Celsius for 20 minutes. Next, the temperature of the gallium nitride substrate 31 is increased to 1130 degrees Celsius. Ammonia and trimethylgallium (TMG) are supplied to the reactor to grow a gallium nitride film 33 having a thickness of 1.5 μm on the gallium nitride substrate 31. Trimethyl aluminum (TMA), TMG, and ammonia are supplied into the reactor to grow an AlGaN film 35 of 30 nm on the gallium nitride film 33. By these processes, an epitaxial substrate A is manufactured. A source electrode 37a and a drain electrode 37b of Ti/Al/Ti/Au are formed on a surface of the epitaxial substrate A, and a gate electrode 39 of Au/Ni is formed on the surface of the epitaxial substrate A. By these processes, an HEMT-A shown in FIG. 2A is manufactured.

EXPERIMENT 1

A sapphire substrate 41 is placed in a reactor of the MOVPE device. Supplying the gases including hydrogen, nitrogen, and ammonia into the reactor, the sapphire substrate 41 undergoes a heat treatment at a temperature of 1170 degrees Celsius for 10 minutes. Next, a seed layer 42 is grown on the sapphire substrate 41. After this, as in Embodiment Example, a gallium nitride film 43 and an AlGaN film 45 are grown to manufacture an epitaxial substrate B. A source electrode 47a and a drain electrode 47b of Ti/Al/Ti/Au are formed on the surface of the epitaxial substrate B, and a gate electrode 49 of Au/Ni is formed on the surface of the epitaxial substrate B. By these processes, an HEMT-B shown in FIG. 2B is manufactured.

Figure 3:
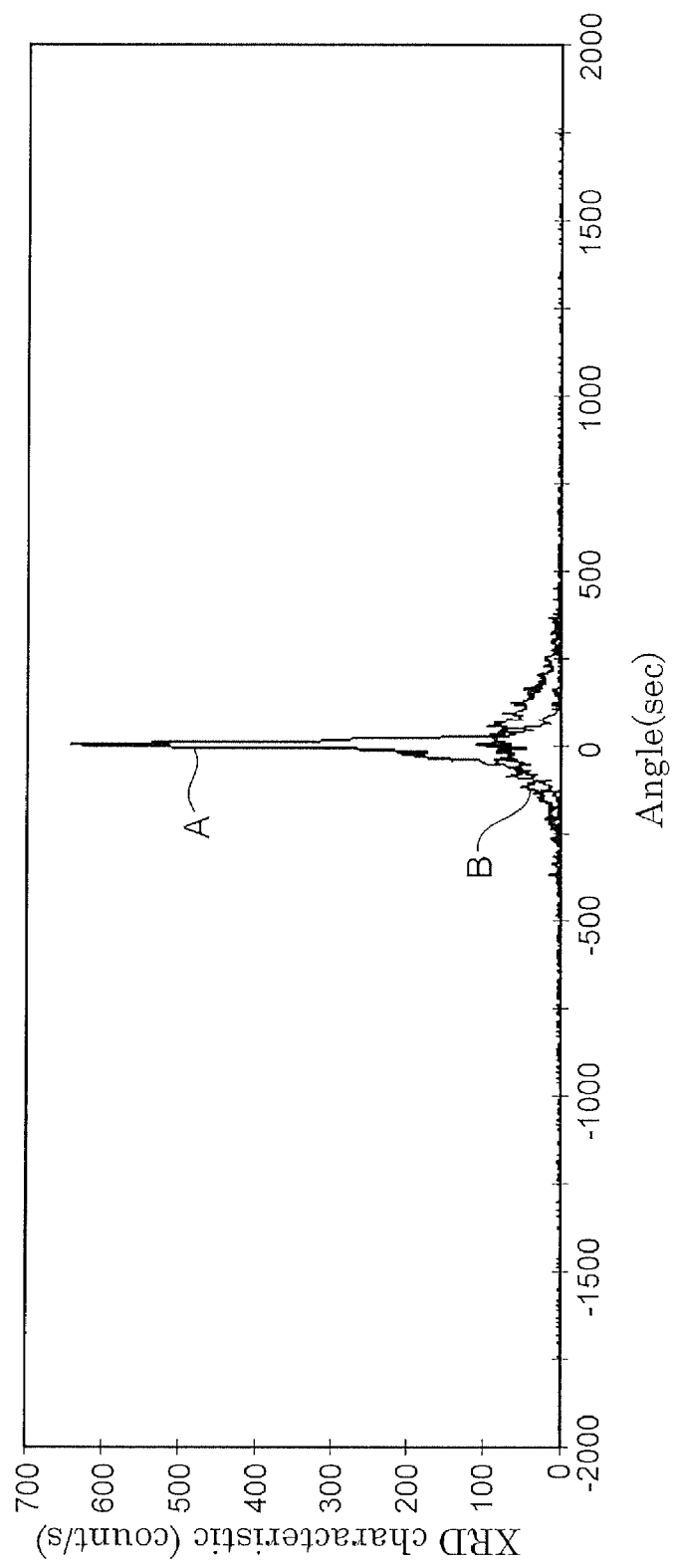
FIG. 3 is a view representing a spectrum for (0002) plane XRD in the surfaces of the AlGaN layers of the epitaxial substrate (sample A) and the epitaxial substrate (sample B) manufactured for the high electron mobility transistors.

FIG. 3 is a view representing a spectrum for (0002) plane XRD in the surfaces of the AlGaN layers of the epitaxial substrate (sample A) and the epitaxial substrate (sample B) manufactured for the high electron mobility transistors. The sample A includes a GaN film and an AlGaN film formed on the gallium nitride substrate in this order. The sample B includes a seed film, a GaN film and an AlGaN film formed on the sapphire substrate in this order. On each of the AlGaN films, a Schottky electrode is provided to measure the leakage current. The Schottky electrode has an area of $7.85 \times 10^{-5}$ cm$^2$, and the applied voltage is −5 volts, for example.

Sample A
FWHM of XRD: 22.4 (sec),
Leakage current density: $1.75 \times 10^{-6}$ (A/cm$^2$);
Sample B
FWHM of XRD: 214.4 (sec),
Leakage current density: $1.79 \times 10^{-2}$ (A/cm$^2$).

The leakage current in the sample A is largely reduced compared to the leakage current in the sample B. The reason is that as far as XRD of the AlGaN layer is concerned, FWHM of the sample A is more acute than that of the sample B.

Figure 4:
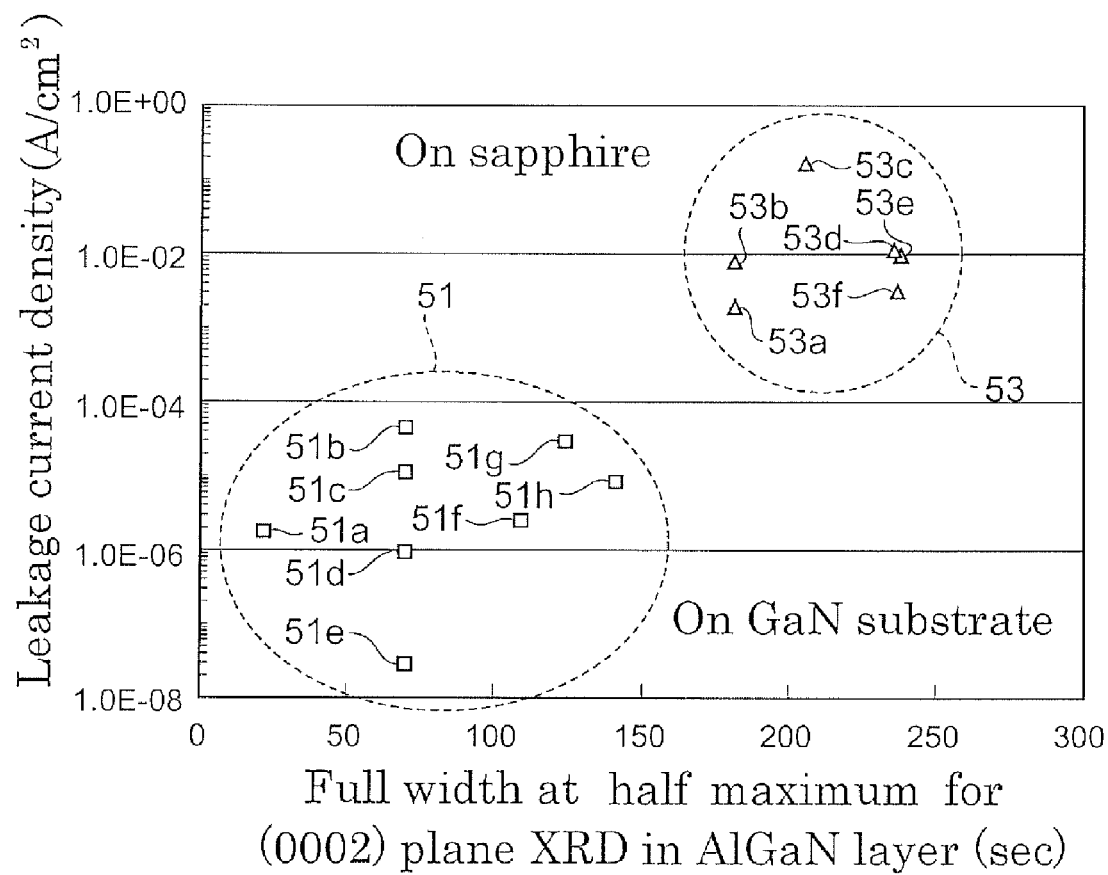
FIG. 4 is a view representing correspondences between leakage current density and the full-width-at-half maximum for (0002) plane XRD characteristic in the gallium nitride layer.

The XRD in the (0002) plane has a wider full-width at half-maximum as the number of the screw dislocations included in the AlGaN layer is larger. Therefore, by making the full-width at half-maximum small, the leakage current from the Schottky electrode can be reduced. The forward current through the gate electrode of the HEMT is about 0.1 A/cm$^{-2}$, therefore, it is necessary to limit the leakage current to $1 \times 10^{-4}$ A/cm$^2$, 1/1000 of the forward current or less. As shown in FIG. 4, since the Al$_y$Ga$_{1-y}$N epitaxial layer has a full-width at half-maximum for (0002) plane XRD of 150 sec or less, the leakage current can be $1 \times 10^{-4}$ A/cm$^2$ or less. Although it is principally possible to evaluate the crystal quality of the AlGaN layer with XRDs of (0004) plane or (0006) plane, other than (0002) plane, (0002) plane is preferable for evaluating the crystal quality of the AlGaN layer because (0002) plane has the great XRD strength.

FIG. 4 is a view representing correspondences between leakage current density and the full-width-at-half maximum for (0002) plane XRD characteristic in the gallium nitride layer. Symbols indicated by reference marks 51a through 51h represent values obtained by measuring structures in which Schottky electrodes are manufactured on the AlGaN layer fabricated by utilizing the gallium nitride substrate. Symbols indicated by reference marks 53a through 53f represent values obtained by measuring structures in which Schottky electrodes are formed on the AlGaN layers fabricated by utilizing the sapphire substrates.

Embodiment Example 2

To present specific examples:
Sample indicated by the reference mark 51a—
Full-width-at-half maximum: 22.4 sec,
Leakage current density: $1.75 \times 10^{-6}$ A/cm$^2$;
Sample indicated by the reference mark 51b—
Full-width-at-half maximum: 70.3 sec,
Leakage current density: $4.37 \times 10^{-5}$ A/cm$^2$;
Sample indicated by the reference mark 51c—
Full-width-at-half maximum: 70.3 sec,
Leakage current density: $1.11 \times 10^{-5}$ A/cm$^2$;
Sample indicated by the reference mark 51d—
Full-width-at-half maximum: 70.9 sec,
Leakage current density: $9.01 \times 10^{-7}$ A/cm$^2$;
Sample indicated by the reference mark 51e—
Full-width-at-half maximum: 70.9 sec,
Leakage current density: $2.72 \times 10^{-8}$ A/cm$^2$;
Sample indicated by the reference mark 51f—
Full-width-at-half maximum: 110.1 sec,
Leakage current density: $2.45 \times 10^{-6}$ A/cm$^2$;
Sample indicated by the reference mark 51 g—
Full-width-at-half maximum: 124.8 sec,
Leakage current density: $3.05 \times 10^{5}$ A/cm$^2$;
Sample indicated by the reference mark 51 h—
Full-width-at-half maximum: 141.3 sec,
Leakage current density: $9.70 \times 10^{-6}$ A/cm$^2$.

EXPERIMENT 2

To present a specific example:
Schottky diode structure of the reference mark 53a (with the smallest full-width-at-half maximum and leakage current density)—
Full-width-at-half maximum: 182.6 sec,
Leakage current density: $2.15 \times 10^{-3}$ A/cm$^2$.

In the high electron mobility transistor 11, a supporting substrate 13 of nitride is composed of gallium nitride conductive or semi-insulating. In this example, the gallium nitride region is homoepitaxially grown on the gallium nitride supporting substrate. The gallium nitride supporting substrate has a carrier concentration of $1 \times 10^{19}$ cm$^{-3}$ or less. The GaN layer 17 has a thickness between 0.1 μm and 1000 μm, inclusive. The GaN layer 17 has a carrier concentration of $1 \times 10^{17}$ cm$^{-3}$ or less. The AlGaN layer 15 has a thickness between 5 nm and 50 nm, inclusive. The AlGaN layer 15 has a carrier concentration of $1\times10^{19}$ cm$^{-3}$ or less.

In the high electron mobility transistor 11, aluminum mole fraction y of the $Al_yGa_{1-y}N$ epitaxial layer 15 is preferably 0.1 or more. If the aluminum mole fraction y is less than 0.1, the band offset becomes small so that two-dimensional electron gas having enough density can not be formed at the AlGaN/GaN interface. Furthermore, the aluminum mole fraction y is preferably 0.7 or less. If the aluminum mole fraction y is more than 0.7, it is highly likely that cracks are generated in the AlGaN layer. The generation of the cracks prevents the two-dimensional electron gas from being formed at the AlGaN/GaN interface.

In the high electron mobility transistor 11, the $Al_yGa_{1-y}N$ epitaxial layer 15 preferably has a thickness of 5 nm or more. If the thickness of the $Al_yGa_{1-y}N$ epitaxial layer 15 is less than 5 nm, the distortion at the AlGaN/GaN interface becomes small and the two-dimensional electron gas is not formed. Furthermore, the $Al_yGa_{1-y}N$ epitaxial layer 15 preferably has a thickness of 50 nm or less. If the thickness of the $Al_yGa_{1-y}N$ epitaxial layer is more than 50 nm, it is highly likely that the cracks are generated in the AlGaN layer. The generation of cracks prevents the two-dimensional electron gas from being formed at the AlGaN/GaN interface.

The $Al_yGa_{1-x}N$ supporting substrate for the high electron mobility transistor 11 is preferably composed of gallium nitride. Accordingly, Group III nitride semiconductor devices are provided using a supporting substrate of a low dislocation density.

Embodiment Mode 2

Figure 5A:
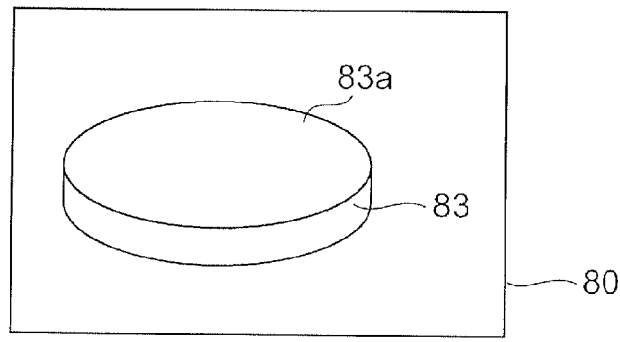
FIG. 5A is a view representing the manufacture of the epitaxial substrate involving Embodiment Mode 2.
Figure 5B:
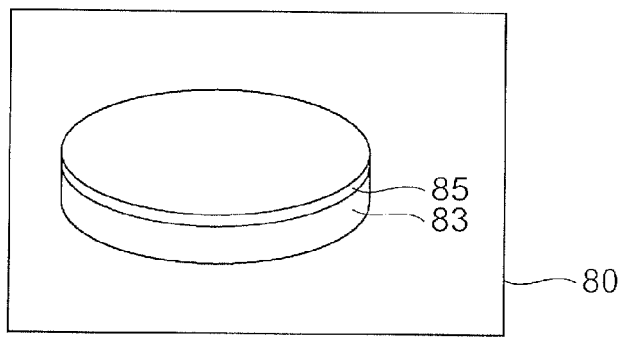
FIG. 5B is a view representing the manufacture of the epitaxial substrate involving Embodiment Mode 2.
Figure 5C:
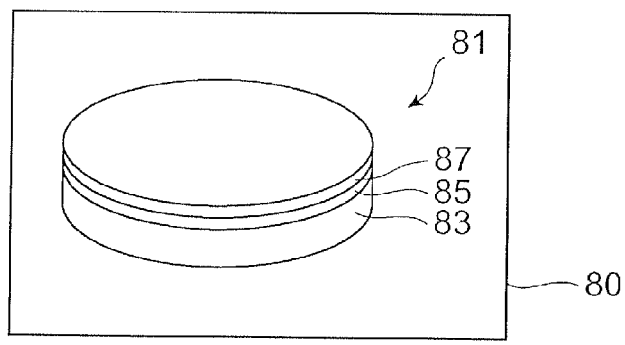
FIG. 5C is a view representing the manufacture of the epitaxial substrate involving Embodiment Mode 2.

FIG. 5A, FIG. 5B, and FIG. 5C are views representing manufacture of the epitaxial substrate according to Embodiment Mode 2. As shown in FIG. 5A, a gallium nitride freestanding substrate 83 having conductivity is placed in a reactor 80. The following crystal growth is preferably performed by MOVPE method. The gallium nitride freestanding substrate 83 has a carrier concentration of $1\times10^{19}$ cm$^{-3}$ or less. As shown in FIG. 5B, by supplying TMG and NH$_3$, a GaN epitaxial film 85 is deposited on a first surface 83a of the gallium nitride freestanding substrate 83. The GaN epitaxial film 85 is preferably undoped. The GaN epitaxial film 85 is deposited at a temperature between 600 degrees Celsius and 1200 degrees Celsius, inclusive. The pressure in the reactor is between 1 kPa and 120 kPa, inclusive. The gallium nitride epitaxial film 85 has a thickness between 0.5 μm and 1000 μm, inclusive. The GaN epitaxial film 85 has a carrier concentration of $1\times10^{17}$ cm$^{-3}$ or less. If necessary, in advance of the growth of the GaN epitaxial film 85, a buffer layer can be grown. The buffer layer may be composed of any of AlN, GaN, AlGaN, InGaN, and AlInGaN. The buffer layer restrains defects or impurities of the gallium nitride freestanding substrate 83 from affecting the GaN epitaxial layer 85, so that quality of the GaN epitaxial layer 85 can be improved.

Next, as shown in FIG. 5C, TMA, TMG and NH$_3$ are supplied to deposit an undoped or n-type AlGaN epitaxial film 87 onto the undoped GaN epitaxial film 85. The AlGaN epitaxial film 87 is deposited at a temperature between 600 degrees Celsius and 1200 degrees Celsius, inclusive. The pressure in the reactor is between 1 kPa and 120 kPa, inclusive. The aluminum mole fraction of the AlGaN epitaxial film 87 is between 0.1 and 0.7, inclusive. The AlGaN epitaxial film 87 has a thickness of 5 nm and 50 nm, inclusive. The AlGaN epitaxial film 87 has a carrier concentration of $1\times10^{19}$ cm$^{-3}$ or less. Accordingly, an epitaxial substrate 81 is obtained. By making use of this substrate, an HEMT according to Embodiment Mode 1 can be manufactured.

The inventors have found that the leakage current from the Schottky electrode in contact with the $Al_yGa_{1-y}N$ epitaxial film 87 ($0<y\leq1$) is related to the full-width-at-half maximum for (0002) plane XRD. In the epitaxial substrate, the leakage current from the Schottky electrode formed on the $Al_yGa_{1-y}N$ epitaxial is small. Accordingly, an epitaxial substrate preferable for the high electron mobility transistor can be provided, for example. Especially, if the full-width-at-half maximum for (0002) plane XRD is 150 sec or less, as apparent from FIG. 4, it is possible to reduce the leakage current from the Schottky electrode compared to a case of 150 sec or more.

On a surface of the AlGaN epitaxial film 87 of the epitaxial substrate 81, a Schottky electrode film for a gate electrode and ohmic electrode films for a source electrode and a drain electrode are deposited. The Schottky electrode and the ohmic electrode are formed from the Schottky electrode film and the ohmic electrode film, respectively. After thinning a portion of the AlGaN epitaxial film 87 immediately under the Schottky electrode, a Schottky electrode may be formed on the portion. This enables designing for, among other features, lower source resistance, improved transconductance, and normally-off mode. Furthermore, by adding n-type dopant, an n-type semiconductor region may be formed immediately under the source electrode and/or the drain electrode. Furthermore, n-type semiconductor regions to which n-type dopant is added may be grown as contact layers on the surface of the AlGaN epitaxial film 87, and on the contact layers a source electrode and/or a drain electrode may be formed. Accordingly, the contact resistance can be reduced. Furthermore, after thinning a portion of the AlGaN layer, a source and/or a drain electrode may be formed on the portion. Accordingly, the contact resistance can be reduced. Alternatively, the source and/or drain electrode may be formed to be in contact with the GaN layer having a band gap smaller than that of AlGaN by removing the AlGaN layer. Accordingly, the contact resistance can be reduced. Since the full-width-at-half maximum for (0002) plane XRD in the AlGaN region is used as an indicator of the crystal quality to monitor the quality of the AlGaN film with which the Schottky electrode constitutes a Schottky junction, an epitaxial substrate can be provided for semiconductor devices in which the backward leak current flowing through the Schottky junction when a voltage is applied across the Schottky electrode and the ohmic electrode can be reduced.

Figure 6:
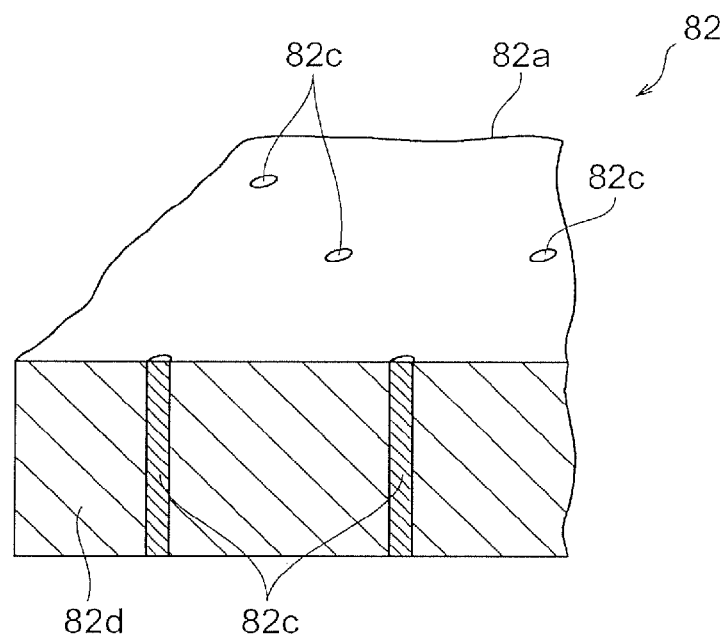
FIG. 6 is a view representing one example of locations of the high dislocation regions and the low dislocation regions in the gallium nitride freestanding substrate for Embodiment Modes 1 and 2.

FIG. 6 is a view representing one example of locations of high dislocation regions and low dislocation regions in a gallium nitride freestanding substrate for Embodiment Modes 1 and 2. A first surface 82a of the gallium nitride freestanding substrate 82 for the epitaxial substrate 81 includes first areas where high dislocation regions 82c having a relatively large screw dislocation density appear, and a second area where a low dislocation region 82d having a relatively small screw dislocation density appears. The high dislocation regions 82c are surrounded by the low dislocation region 82d, and the first areas are randomly distributed in a dot-like pattern in the second area on the first surface 82a. As a whole, the screw dislocation density is $1\times10^8$ cm$^{-2}$ or less, for example. The epitaxial substrate 81 gives an epitaxial layer having a lowered dislocation density in the low dislocation region 82d. Consequently, the reverse leakage current is reduced and the reverse breakdown voltage is improved.

Figure 7:
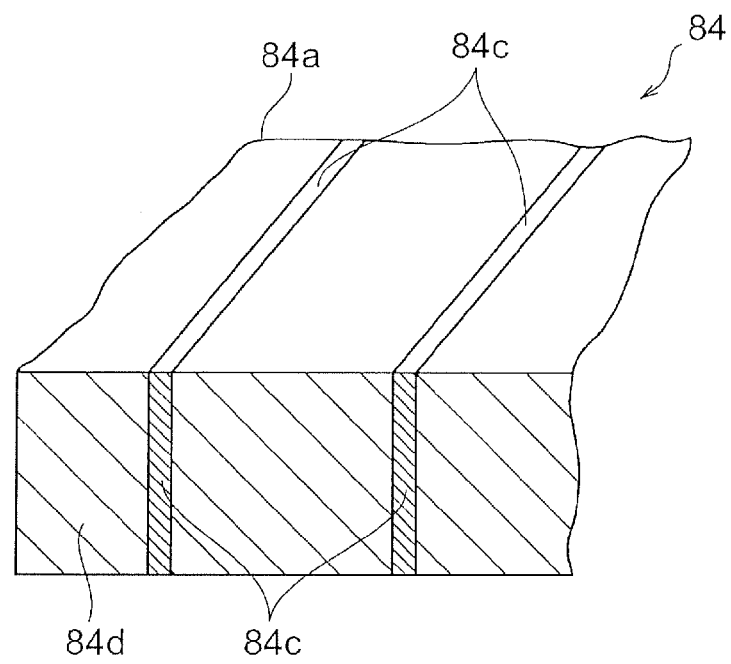
FIG. 7 is a view representing another example of locations of the high dislocation areas and the low dislocation areas in the gallium nitride freestanding substrate for Embodiment Modes 1 and 2.

FIG. 7 is a view representing another example of locations of the high dislocation regions and the low dislocation regions in a gallium nitride freestanding substrate for Embodiment Modes 1 and 2. A first surface 84a of the gallium nitride freestanding substrate 84 for the epitaxial substrate 81 includes first areas where high dislocation regions 84c having a relatively large screw dislocation density appear, and second areas where low dislocation regions 84d having a relatively small screw dislocation density appear. The high dislocation regions 84c are surrounded by the low dislocation regions 84d, and the first areas are distributed in a striped pattern in the second area on the first surface 84a. As a whole, the screw dislocation density is $1\times10^8$ cm$^{-2}$ or less, for example. The epitaxial substrate 81 gives an epitaxial layer having a lowered dislocation density in the low dislocation regions 84d. Accordingly, the reverse leakage current is decreased, and the reverse breakdown voltage is improved.

In the present embodiment, as in Embodiment Mode 1, as a freestanding substrate, the $Al_yGa_{1-x}N$ ($0<x\leq1$) substrate can be used. More specifically, the freestanding substrate can be composed of AlN, AlGaN or GaN.

Figure 8:
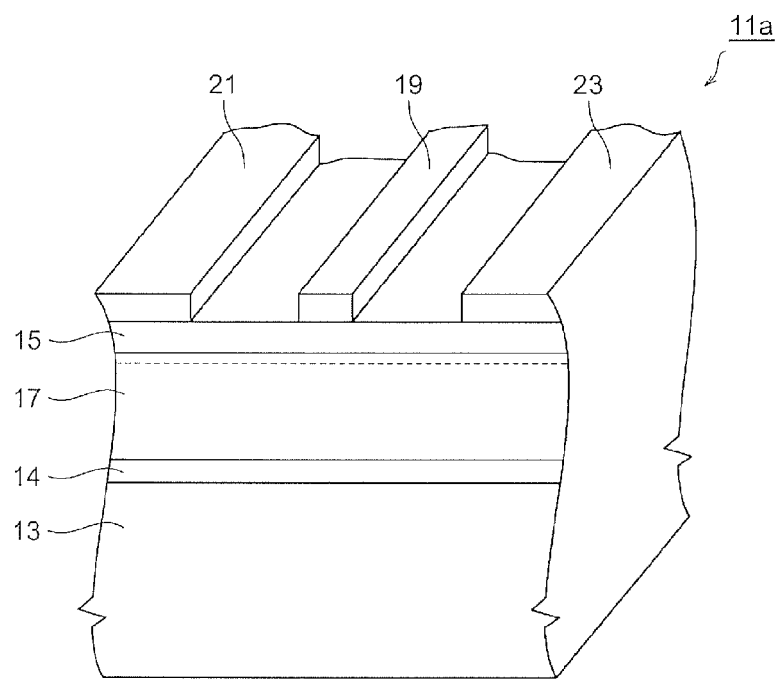
FIG. 8 is a view representing the high electron mobility transistor according to one modification of Embodiment Mode 1.

FIG. 8 is a view representing the high electron mobility transistor according to one modification of Embodiment Mode 1. Referring to FIG. 8, the high electron mobility transistor 11a can be provided with an additional gallium nitride semiconductor layer 14 between the GaN epitaxial layer 17 and the gallium nitride supporting substrate 13. The gallium nitride semiconductor layer 14 is composed of AlN, GaN, AlGaN, InGaN, or AllnGaN, for example. The gallium nitride semiconductor layer 14 restrains the affects of defects of and impurities on the supporting substrate from propagating to upper layers, thereby improving the quality of the GaN epitaxial layer 17.

Figure 9:
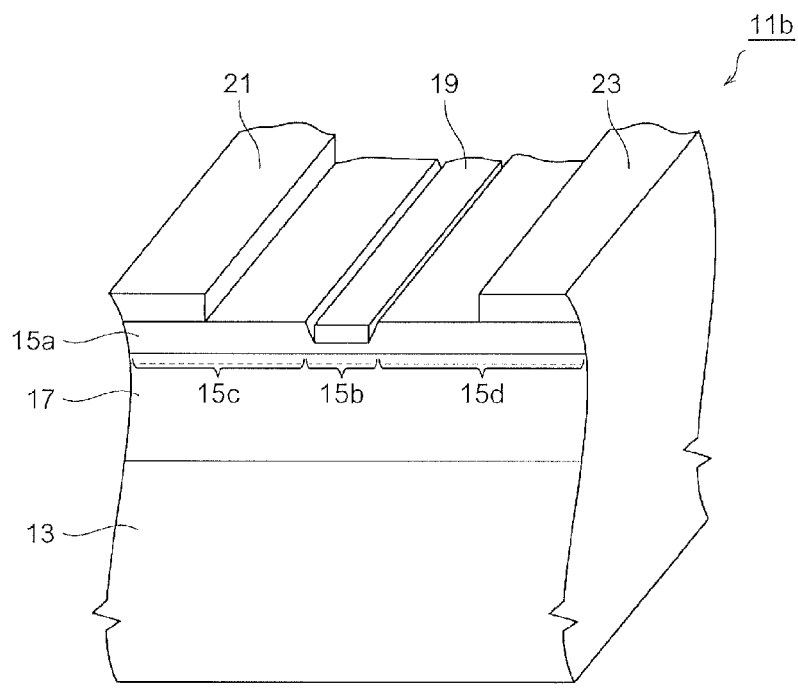
FIG. 9 is a view representing the high electron mobility transistor according to other modification of Embodiment Mode 1.

FIG. 9 is a view representing the high electron mobility transistor according to other modification of Embodiment Mode 1. The high electron mobility transistor 11b can be provided with an AlGaN layer 15a, in place of the AlGaN layer 15 of the high electron mobility transistor 11a. The AlGaN layer 15a includes a first portion 15b, a second portion 15c, and a third portion 15d. The first portion 15b is positioned between the second portion 15c and the third portion 15d. The thickness of the first portion 15b is smaller than that of the second portion 15c and that of the third portion 15d, thereby forming a recess structure in the AlGaN layer 15a. On the first portion 15b, a gate electrode 19a is provided. The recess structure is formed by thinning the $Al_yGa_{1-y}N$ epitaxial layer 15 by etching, for example. The recess gate structure enables designing for reduced source resistance, improved transconductance, and normally-off mode, etc.

Figure 10:
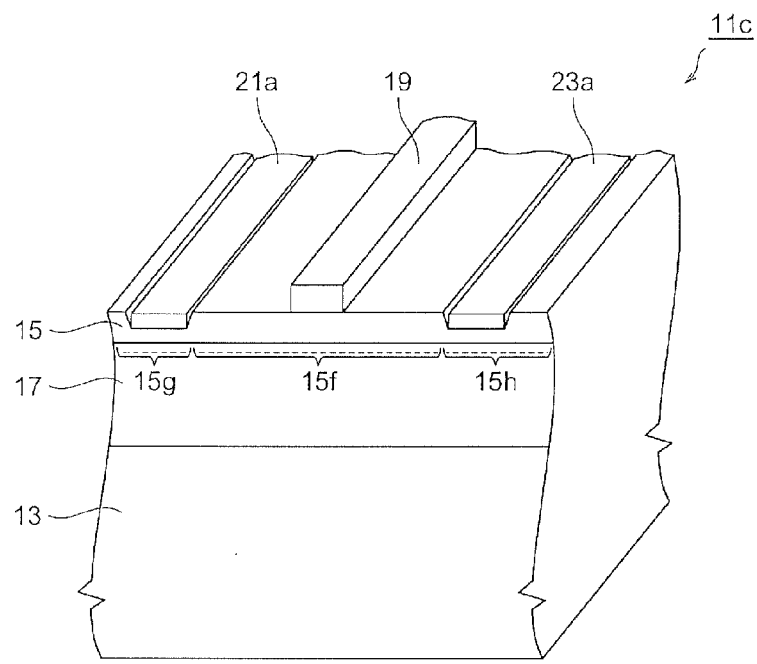
FIG. 10 is a view representing the high electron mobility transistor according to other modification of Embodiment Mode 1.

FIG. 10 is a view representing the high electron mobility transistor according to other modification of Embodiment Mode 1. The high electron mobility transistor 11c may be provided with an AlGaN layer 15e, in place of the AlGaN layer 15 of the high electron mobility transistor 11a. The AlGaN layer 15e includes a first portion 15f, a second portion 15g, and a third portion 15h. The first portion 15f is positioned between the second portion 15g and the third portion 15h. The thickness of the first portion 15f is larger than that of the second portion 15g and that of the third portion 15h, thereby forming a recess structure in the AlGaN layer 15e. The recess structure can be formed by thinning the $A_fyGa_{1-y}N$ epitaxial layer 15 by etching, for example. The source electrode 21a is provided on the second portion 15g, and the source electrode 23a is provided on the third portion 15h. This recess ohmic structure can reduce the contact resistance.

Figure 11:
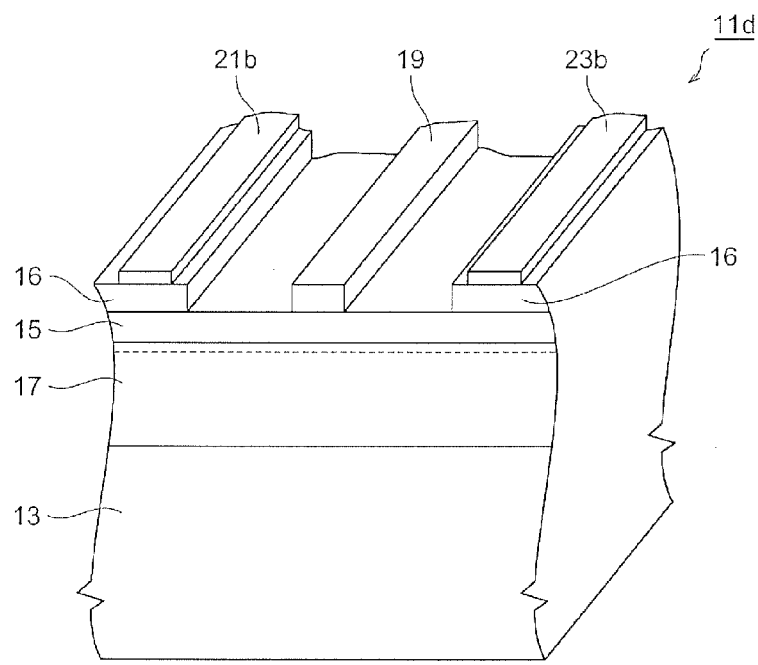
FIG. 11 is a view representing the high electron mobility transistor according to other modification of Embodiment Mode 1.

FIG. 11 is a view representing the high electron mobility transistor according to other modification of Embodiment Mode 1. The high electron mobility transistor 11d can be furtherer provided with contact layers 16 for a source electrode and a drain electrode. The contact layers 16 are provided on the AlGaN layer 15 of the high electron mobility transistor 11a. The contact layers 16 may be composed of gallium nitride semiconductors such as GaN, InN, and InGaN. The band gap of the contact layer 16 is preferably smaller than that of the AlGaN layer 15. In addition, the carrier concentration of the contact layer 16 is preferably larger than that of the AlGaN layer 15. The gate electrode 19 constitutes a Schottky junction with the AlGaN layer 15, and the source electrode 21b and the drain electrode 23b constitute ohmic contacts with the contact layer. The contact layer added structure can reduce the contact resistance.

In the preferable embodiments, principles of the present invention were described with illustrations, but it will be recognized by persons skilled in the art that the present invention can be changed in locations and in detail without departing from the principles. The present invention is not limited to the specific configurations disclosed in the present embodiments. Accordingly, the rights in the scope of the patent claims, and in all modifications and changes deriving from the scope of the spirit thereof are claimed.

The invention claimed is:

1. A Group III nitride semiconductor device characterized in being furnished with:
    a supporting substrate composed of GaN, said supporting substrate having a screw dislocation density of not greater than $1\times10^8$cm$^{-2}$ and a carrier concentration of not greater than $1\times10^{19}$cm$^{-3}$;
    an undoped gallium nitride homoepitaxial layer provided on said substrate, said gallium nitride homoepitaxial layer having a thickness of from 0.5 μm to 1000 μm and a carrier concentration of not greater than $1\times10^{17}$cm$^{-3}$; and
    an $Al_yGa_{1-y}N$ ($0.1\leq y\leq0.7$) epitaxial layer having a thickness of from 5 nm to 50 nm and a carrier concentration of not greater than $1\times10^{19}$cm$^{-3}$, provided on said gallium nitride homoepitaxial layer; whereby
    said $Al_yGa_{1-y}N$ ($0.1\leq y\leq0.7$) epitaxial layer has a full-width at half-maximum for (0002) plane XRD of 150 arcsec or less;
    a Schottky electrode provided on said $Al_yGa_{1-y}N$ ($0.1\leq y\leq0.7$) epitaxial layer;
    a source electrode provided on said $Al_yGa_{1-y}N$ ($0.1\leq y\leq0.7$) epitaxial layer; and
    a drain electrode provided on said $Al_yGa_{1-y}N$ ($0.1\leq y\leq0.7$) epitaxial layer.

2. An epitaxial substrate for a Group III nitride semiconductor device, said epitaxial substrate characterized in being furnished with:
    a substrate composed of GaN, said substrate having a screw dislocation density of not greater than $1\times10^8$cm$^{-2}$ and a carrier concentration of not greater than $1\times10^{19}$cm$^{-3}$;
    an undoped gallium nitride homoepitaxial film provided on said substrate, said gallium nitride homoepitaxial film having a thickness of from 0.5 μm to 1000 μm and a carrier concentration of not greater than $1\times10^{17}$cm$^{-3}$; and
    an $Al_yGa_{1-y}N$ ($0.1\leq y\leq0.7$) epitaxial film having a thickness of from 5 nm to 50 nm and a carrier concentration of not greater than $1\times10^{19}$cm$^{-3}$, provided on said gallium nitride homoepitaxial film; whereby
    said $Al_yGa_{1-y}N$ ($0.1\leq y\leq0.7$) epitaxial film has a full-width at half-maximum for (0002) plane XRD of 150 arcsec or less.

* * * * *